United States Patent
Yoon et al.

(10) Patent No.: US 7,329,553 B2
(45) Date of Patent: Feb. 12, 2008

(54) METHOD OF FABRICATING ONE-WAY TRANSPARENT OPTICAL SYSTEM

(75) Inventors: Yong-seop Yoon, Seoul (KR); Byoung-ho Cheong, Seoul (KR); Seok-whan Chung, Suwon-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 231 days.

(21) Appl. No.: 11/290,412

(22) Filed: Dec. 1, 2005

(65) Prior Publication Data
US 2006/0115914 A1    Jun. 1, 2006

(30) Foreign Application Priority Data
Dec. 1, 2004   (KR) ...................... 10-2004-0099744

(51) Int. Cl.
*H01L 21/00* (2006.01)
(52) U.S. Cl. ............................ 438/29; 438/22; 438/16; 438/27; 438/65; 257/E31.11; 257/E31.127
(58) Field of Classification Search ................ 438/29, 438/48; 359/626; 257/233
See application file for complete search history.

(56) References Cited

U.S. PATENT DOCUMENTS

| | | | |
|---|---|---|---|
| 2001/0027971 A1* | 10/2001 | Sakurai et al. | 219/411 |
| 2004/0096771 A1* | 5/2004 | Kashiwagi et al. | 430/192 |
| 2006/0056034 A1* | 3/2006 | Tsuruma | 359/626 |

* cited by examiner

*Primary Examiner*—Michael Lebentritt
*Assistant Examiner*—Abdulfattah Mustapha
(74) *Attorney, Agent, or Firm*—Sughrue Mion, PLLC

(57) ABSTRACT

A method of fabricating a one-way transparent optical system by which external light is effectively intercepted and internal light passes nearly without loss is provided. The method includes: forming a photoresist on an upper surface of a transparent substrate; heating and carbonizing the photoresist to form a black body layer; patterning the black body layer to form a plurality of light-absorbing materials on the transparent substrate; and forming protrusion structures having a shape of a convex lens shape for refracting incident light toward a corresponding light-absorbing material of the light-absorbing materials, on the transparent substrate on which the light-absorbing materials are formed.

14 Claims, 6 Drawing Sheets

METHOD OF FABRICATING ONE-WAY TRANSPARENT OPTICAL SYSTEM

CROSS-REFERENCE TO RELATED PATENT APPLICATIONS

This application claims priority from Korean Patent Application No. 10-2004-0099744, filed on Dec. 1, 2004, in the Korean Intellectual Property Office, the disclosure of which is incorporated herein in its entirety by reference.

BACKGROUND OF THE INVENTION

1. Field of the Invention

The present invention relates to a method of fabricating a one-way transparent optical system and, more particularly, to a method of fabricating a one-way transparent optical system by which external light is effectively intercepted and internal light passes nearly without loss.

2. Description of the Related Art

When using an emissive type display device such as an organic electroluminescent (EL), external light is reflected on the surface of the display device so that glare occurs and contrast decreases due to the external light reflected by a metallic electrode. To prevent these problems, in the prior art, an antireflective coating, a polarizer, and a ¼ waveplate, as shown in FIG. 1, have been used. That is, reflection of external light 20 on the surface of the display device is minimized using an antireflective coating, thereby preventing glare. A polarizer 12 and a ¼ waveplate 11 are formed on the surface of the display device and suppress re-emission of external light incident into the display device, thereby preventing a decrease in contrast. That is, as shown in FIG. 1, the external light 20 that has passed through the polarizer 12 has only linear polarization components. The external light 20 having only linear polarization components is changed into circular polarization by the ¼ polarization plate 11, and thus does not pass through the polarizer 12 during reflection. Thus, re-emission of external light incident into the display device is suppressed.

However, in the prior art, due to the ¼ waveplate 11 and the polarizer 12, emission of internal light as well as external light is limited so that only about 50% more internal light can be emitted from the inside of the display device. Thus, in a conventional structure for preventing glare and a decrease in contrast, optical efficiency and brightness of the display device are decreased.

FIG. 2 shows an organic electroluminescent (EL) element having a glare-preventing structure using a light-absorbing material, instead of a polarizer. Referring to FIG. 2, in the organic EL element in which a first electrode 22, a hole injecting layer 23, a hole transporting layer (HTL) 24, an organic light-emitting layer 25, an electron transporting layer 26, an electron injecting layer 28, and a second electrode 29 are consecutively stacked on a transparent substrate 21, the electron transporting layer 26 is doped with a light-absorbing material. However, in this structure, since internal light generated in the organic light-emitting layer 25 is also absorbed by the light-absorbing material, only the effects of reducing manufacturing costs are achieved, unlike a structure using a polarizer.

FIG. 3 illustrates a structure of a display device for preventing glare using extinguishment interference. Referring to FIG. 3, the display device has a structure in which a light-emitting layer 32, a second electrode 33, a top protective layer 34 and an antireflective coating layer 35 are consecutively stacked on a first electrode 31. In addition, the first electrode 31 includes a semi-transmission layer 31a, a transmission layer 31b, and a total reflection layer 31c. In this structure, a part L1 of external light is not reflected by the antireflective coating layer 35 but absorbed. Part L2 of light L2 and L3 that have passed through the antireflective coating layer 35 is reflected by the semi-transmission layer 31a and the other part L3 thereof is reflected by the total reflection layer 31c. In this case, light L2 reflected by the semi-transmission layer 31a and light L3 reflected by the total reflection layer 31c interfere with each other and are extinguished. However, even in this structure, since part of internal light generated in the light-emitting layer 32 is reflected by the semi-transmission layer 31a and the total reflection layer 31c and extinguished, internal light also decreases.

SUMMARY OF THE INVENTION

The present invention provides a method of fabricating a one-way transparent optical system in which external light is effectively intercepted and internal light passes nearly without loss.

The present invention also provides a method of fabricating a one-way transparent optical system by which glare and a decrease in contrast do not occur and brightness is high.

The present invention also provides a method of fabricating the one-way transparent optical system simply and at low costs.

According to an aspect of the present invention, there is provided a method of fabricating a one-way transparent optical system, the method including: forming a photoresist on an upper surface of a transparent substrate; heating and carbonizing the photoresist to form a black body layer; patterning the black body layer to form a plurality of light-absorbing materials on the transparent substrate; and forming protrusion structures having, for example, a shape of a convex lens for refracting incident light toward a corresponding light-absorbing material of the light-absorbing materials, on the transparent substrate on which the light-absorbing materials are formed.

The forming of the black body layer may be performed by heating the photoresist to at least 300° C. or more. The heating temperature of the photoresist may be adjusted so that a light absorption degree of the black body layer is adjusted.

The patterning of the black body layer may include: forming a metallic layer on an upper surface of the black body layer; patterning the metallic layer in a predetermined pattern; etching a region of the black body layer that is not covered by the metallic layer; and removing the metallic layer.

The black body layer may be etched by reactive ion etching (RIE) using O2 as a reactive gas.

The forming of the protrusion structures having a convex lens shape may include: stacking a transparent optical material on the transparent substrate on which the light-absorbing materials are formed; patterning the transparent optical material to form a plurality of protrusion structures; and melting and cooling the patterned protrusion structures to form protrusion structures having a convex lens shape.

A refractive index of the transparent optical material may be substantially the same as a refractive index of the transparent substrate.

BRIEF DESCRIPTION OF THE DRAWINGS

The above and other aspects of the present invention will become more apparent by describing in detail exemplary embodiments thereof with reference to the attached drawings, in which.

DETAILED DESCRIPTION OF ILLUSTRATIVE, NON-LIMITING EMBODIMENTS OF THE INVENTION

Figure 1:
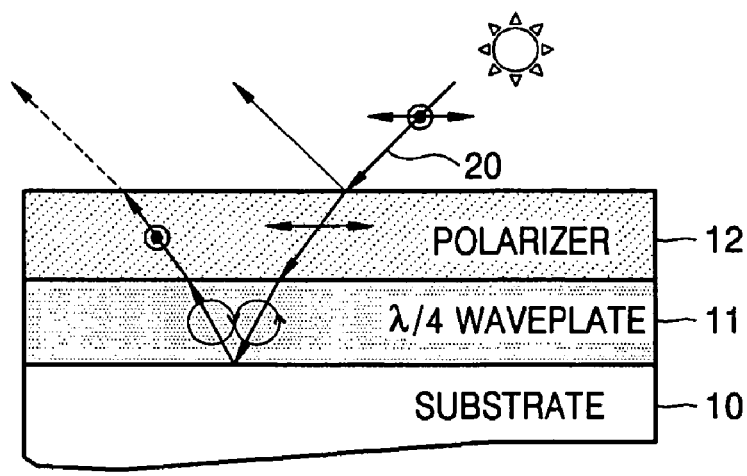
FIG. 1 schematically illustrates a conventional structure for preventing glare.
Figure 2:
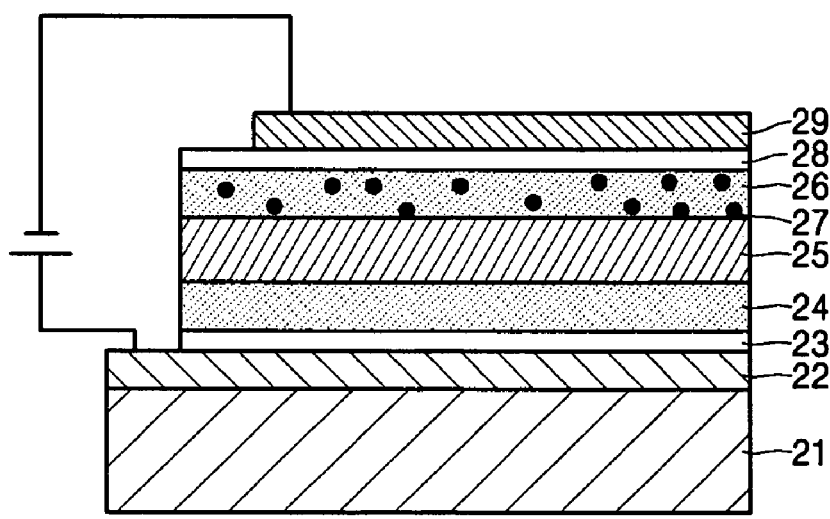
FIG. 2 is a schematic cross-sectional view of the conventional structure for preventing glare using a light-absorbing material.
Figure 3:
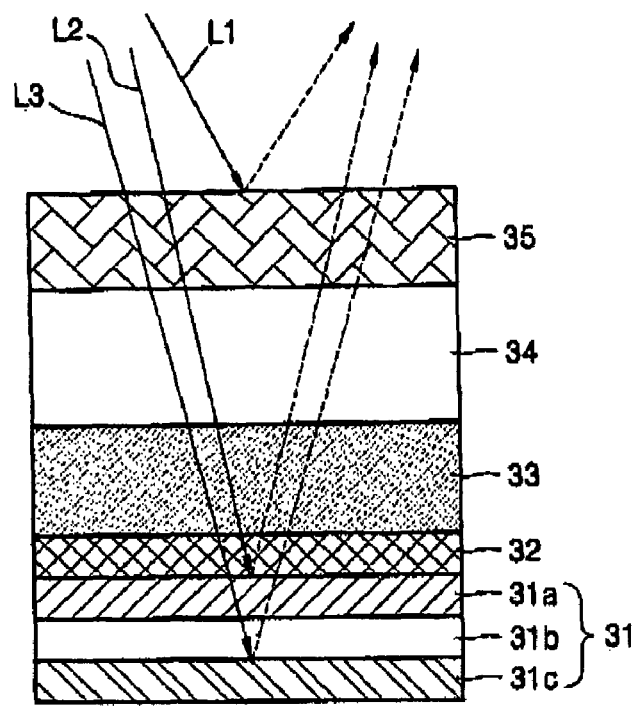
FIG. 3 illustrates a structure of a display device for preventing glare using extinguishment interference.
Figure 4:
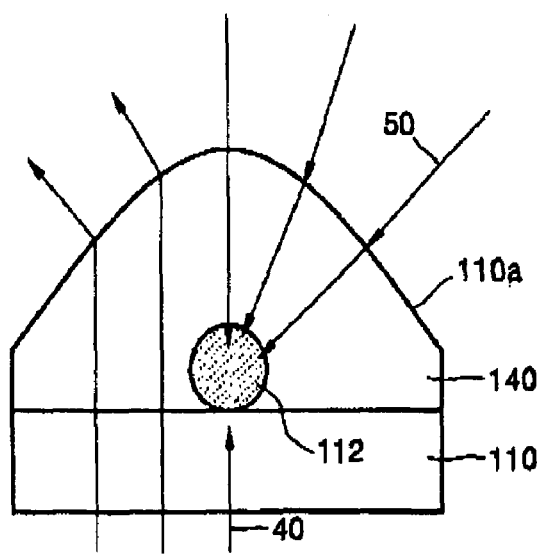
FIG. 4 illustrates a basic structure of a one-way transparent optical system according to an embodiment of the present invention.

FIG. 4 is a cross-sectional view schematically illustrating a structure of a one-way transparent optical system according to an exemplary embodiment of the present invention. Referring to FIG. 4, a transparent optical material 140 is formed on a transparent substrate 110 such as a transparent film. A light-absorbing material 112 is buried in the transparent optical material 140, and a protrusion structure 110a is formed on an upper surface of the transparent optical material 140. The protrusion structure 110a has substantially the shape of a convex lens. However, the protrusion structure 110a may have different shapes such as hemispherical, spheroid, polygonal shapes and the like. The light-absorbing material 112 may be carbon black in which a photoresist is carbonized. The light-absorbing material 112 is disposed near a focusing area of the protrusion structure 110a. Thus, external light 40 incident from the outside is refracted by the protrusion structure 110a having the shape of a convex lens and aimed at the light-absorbing material 112 disposed near the focusing region of the protrusion structure 110a. After that, external light 50 is absorbed by the light-absorbing material 112. In this case, the protrusion structure 110a may have a hemispherical shape, for example, so that external light 50 having a wide incident angle can be refracted toward a substantially small focusing region.

Internal light 40 generated in a display device (not shown) disposed below the transparent substrate 110 proceeds in a direction opposite to the external light 50. The internal light 40 may be image light, for example, and the display device may be a plasma display panel, an organic EL display or different display device. As shown in FIG. 4, the light-absorbing material 112 has a small horizontal cross-section. Thus, most internal light 40 generated in a light-emitting layer is not absorbed into the light-absorbing material 112 but passes through the transparent substrate 110 without loss and is emitted. Only a very small part of the internal light 40 collides with the light-absorbing material 112 and is absorbed thereinto.

According to the embodiment of the present invention, the protrusion structure 110a may have a diameter of about 0.1 to 100 μm, preferably, 1 to 10 μm. In another embodiment of the present invention, the protrusion structure 110a has a diameter of about 3 to 10 μm. The diameter of the light-absorbing material 112 may be half of the diameter of the protrusion structure 110a at the maximum. For balance of the external light 50 absorbed by the light-absorbing material 112 and the internal light 40 emitted by the light-emitting layer, the diameter of the light-absorbing material 112 is selected by considering the diameter of the protrusion structure 110a. That is, the diameter of the light-absorbing material 112 should be large enough to absorb the external light 50 and simultaneously small enough so that the internal light 40 emitted from the light-emitting layer is not excessively intercepted. For example, the diameter of the light-absorbing material 112 may be between $1/100$ and $1/2$, preferably, between $1/5$ and $1/3$, of the diameter of the protrusion structure 110a.

Figure 5:
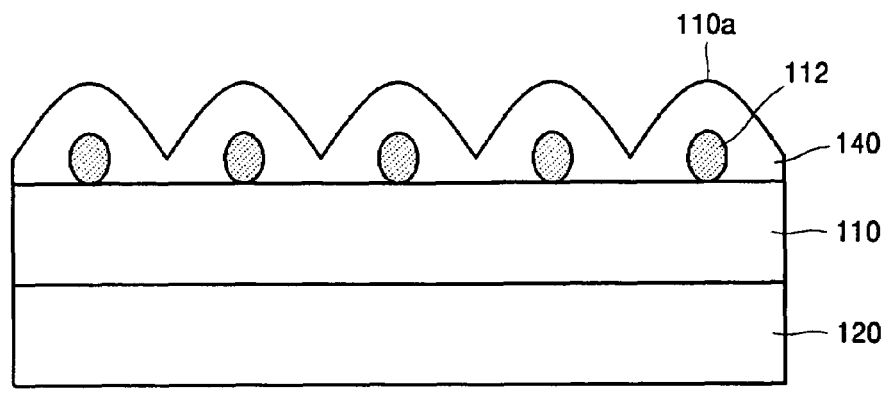
FIG. 5 illustrates a structure of a one-way transparent optical system according to an embodiment of the present invention.

FIG. 5 illustrates an example in which an antireflective and glare-preventing layer is formed on a display device, using an one-way transparent optical system according to the present invention. Referring to FIG. 5, the antireflective and glare-preventing layer has a structure in which the one-way transparent optical system shown in FIG. 4 is arranged two-dimensionally. As described above, external light is refracted by a protrusion structure 110a having the shape of a convex lens and absorbed by a light-absorbing material 112. However, most internal light that has been generated in a display device 120 and has passed through a transparent substrate 110, passes between the light-absorbing materials 112. In this case, only with a very simple structure, most external light can be absorbed and most internal light can pass. Thus, when adopting the one-way transparent optical system in a display device, the brightness of the display device can be increased by nearly 80% and glare due to reflected light hardly occurs.

When reducing the size of the protrusion structure 110a by micrometers (for example, 0.1 to 100 μm), the protrusion structure 110a refracts the external light 50 to make the reflected external light 50 aim at the light-absorbing material 112 and simultaneously, scatters part of the external light 50. Thus, glare that occurs when the external light 50 is reflected on the surface of the protrusion structure 110a can be reduced. In this case, an interval between the protrusion structures 110a and their sizes may be non-uniform so that an interference pattern is not formed by interference between reflected lights.

Figure 6:
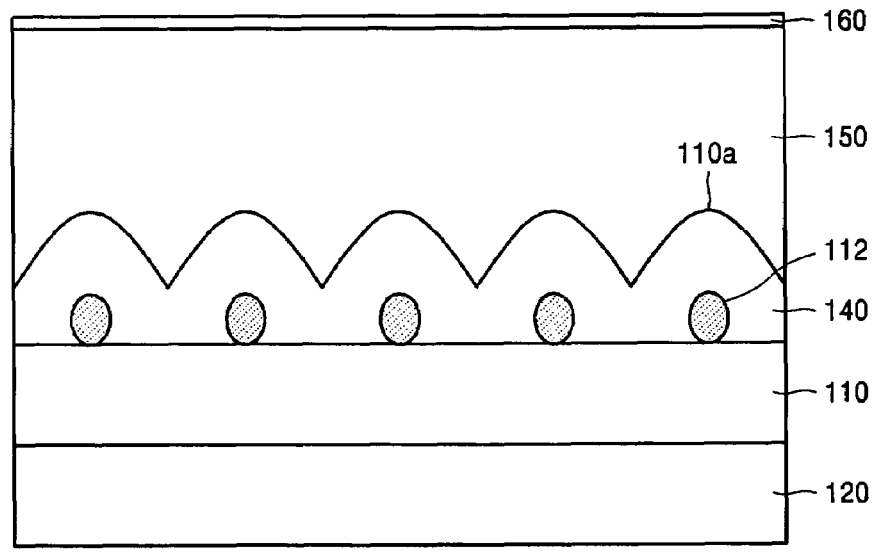
FIG. 6 illustrates a structure of a one-way transparent optical system according to another embodiment of the present invention.

FIG. 6 illustrates an one-way transparent optical system according to another embodiment of the present invention. Referring to FIG. 6, in the one-way transparent optical system, a plurality of protrusion structures 110a having the shape of a convex lens formed of a transparent optical material 140 are formed on an upper surface of a transparent substrate 110, and light-absorbing materials 112 are disposed near a corresponding focusing region of the protrusion structures 110a. The transparent substrate 110 is disposed on a display device 120 such as organic EL. In addition, a light transmission layer 150 is formed on the plurality of protrusion structures 110a, and an antireflective coating 160 is formed on the surface of the light transmission layer 150. Here, the light transmission layer 150 should have a lower refractive index than that of the transparent optical material 140 used in forming the protrusion structures 110a so that the protrusion structures 110a refract incident light toward the light-absorbing materials 112. In this case, owing to the antireflective coating 150, reflection on the surface of the light transmission layer 150 can be nearly eliminated. Most external incident light that has passed through the light transmission layer 150 without being reflected on the surface of the light transmission layer 150, is refracted by the protrusion structures 110a and then absorbed by the light-absorbing material 112. In this case, for the above-described reason, the arrangement of the protrusion structures 110a may be non-uniform.

FIGS. 7A through 7I sequentially illustrate a method of fabricating a one-way transparent optical system having the above-described structure. First, referring to FIG. 7A, a photoresist 130 is coated on a transparent substrate 110 to a thickness of 1 to 2 μm, for example. Here, the transparent substrate 110 may be formed by emulsion polymerizing a transparent material such as methylmethacrylate (MMA). However, formation of the transparent substrate 110 is not limited to this, and a different light transmission material such as glass may be used.

Figure 7A:
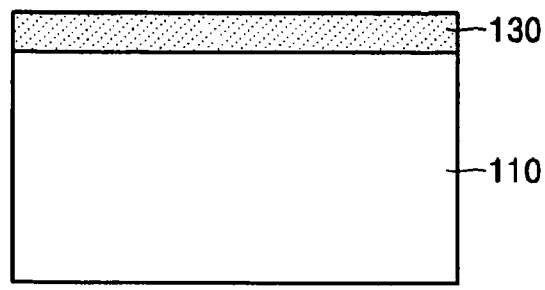
FIGS. 7A through 7I are cross-sectional views illustrating a method of fabricating a one-way transparent optical system according to the present invention.
Figure 7B:
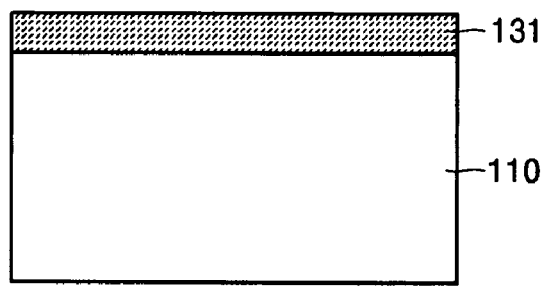
Figure 7C:
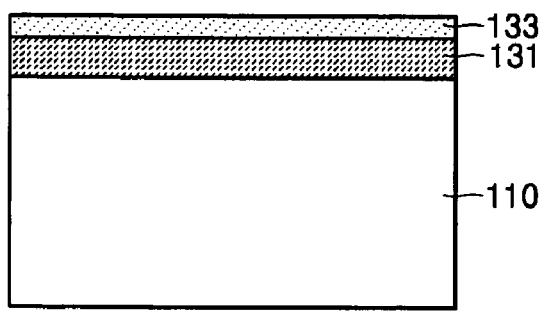
Figure 7D:
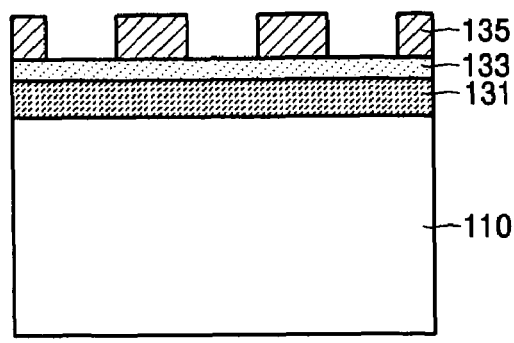

After that, referring to FIG. 7B, the photoresist 130 is carbonized using a hard bake method, for example, thereby forming a black body layer 131. In general, when heating the photoresist 130 at about 300° C., carbonization of the photoresist 130 starts. In general, when heating the photoresist 130 at 300 to 400° C., about 50% of the photoresist 130 is carbonized, and when heating the photoresist 130 at about 1000° C., about 80% of the photoresist 130 is carbonized. When heating and carbonizing the photoresist 130 on the transparent substrate 110, a black body layer 131 mainly made of carbon (C) is formed on the transparent substrate 110. The black body layer 131 contains carbon, and thus can have a sufficient light absorption degree. In addition, since the content of carbon varies according to a carbonization degree of the photoresist 130, a light absorption degree can be properly adjusted. That is, the heating temperature of the photoresist 130 is adjusted if the occasion arises, so that the light absorption degree of the black body layer 131 can be adjusted to a desired value.

Next, the black body layer 131 formed on the transparent substrate 110 is patterned to have a predetermined size so that a plurality of light-absorbing materials are formed. When coating a photoresist directly on the black body layer 131 to pattern the black body layer 131, the black body layer 131 may be removed simultaneously in a subsequent process of removing the photoresist. This is because the black body layer 131 mainly made of carbon is oxidized when photoresist is removed generally in an $O_2$ atmosphere. To prevent this problem, referring to FIG. 7C, a metallic layer 133 is first formed on the black body layer 131. The metallic layer 133 may be formed using a well-known method such as sputtering or deposition. If the metallic layer 133 has been formed, referring to FIG. 7D, a photoresist 135 is coated on the metallic layer 133 and then patterned in a predetermined shape using photolithography, for example.

Figure 7E:
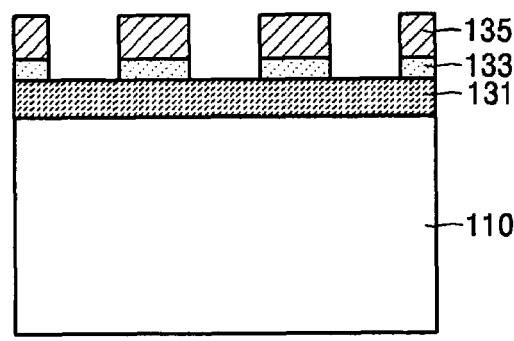
Figure 7F:
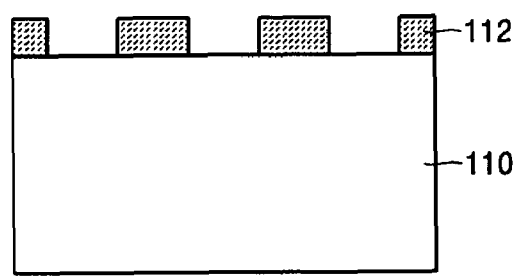

Next, referring to FIG. 7E, the exposed metallic layer 133 is etched using a general method. In this procedure, part of the black body layer 131 is exposed along a pattern of the photoresist layer 135. After that, the exposed black body layer 131 is selectively removed through reactive ion etching (RIE) using $O_2$, for example, as a reactive gas. In this case, the photoresist 135 on the metallic layer 133 is removed simultaneously. If patterning the black body layer 131 has been completed, the metallic layer 133 that remains on the black body layer 131 is removed. Then, referring to FIG. 7F, a plurality of light-absorbing materials 112 formed by patterning the black body layer 131 exist on the transparent substrate 110.

Figure 7G:
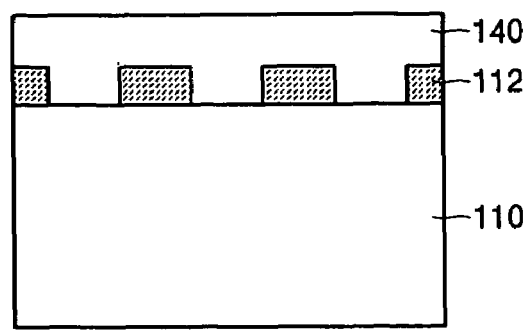
Figure 7H:
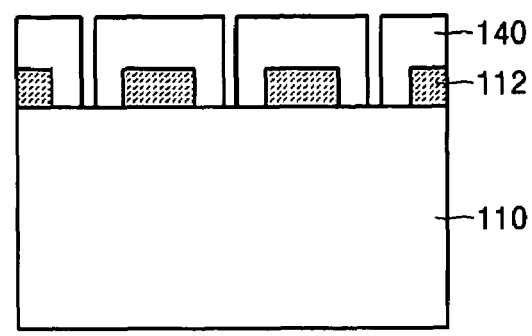

After that, referring to FIG. 7G, a transparent optical material 140 is formed on the transparent substrate 110 on which the light-absorbing structures 112 are formed, to a thickness of about 2-3 μm, for example. Here, PMMA which is the same as the transparent substrate 110, for example, may be used as the transparent optical material 140. However, the transparent optical material 140 is not limited to PMMA and a different transparent material substantially having the same refractive index as that of the transparent substrate 110 may be used. Then, the transparent optical material 140 is patterned so that a plurality of protrusion structures having a rectangular parallelepiped shape are formed. FIG. 7H illustrates the protrusion structures having a rectangular parallelepiped shape formed on the transparent substrate 110. The width of each of the protrusion structures may be about 5 μm, for example. Here, as shown in FIG. 7H, corresponding light-absorbing materials 112 are disposed in the center of lower surfaces of the protrusion structures having a rectangular parallelepiped shape.

Figure 7I:
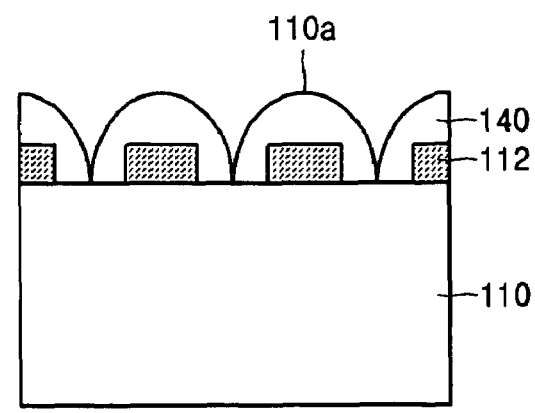

Last, referring to FIG. 7I, the patterned protrusion structures having a rectangular parallelepiped shape are melted and cooled using a well-known bake & reflow process, thereby forming protrusion structures 110a having a convex lens shape. For example, when heating the protrusion structures having a rectangular parallelepiped shape at a predetermined temperature using a hot plate, halogen lamp or laser beam, the protrusion structures having a rectangular parallelepiped shape are melted and gradually changed into a hemispherical shape, for example. In this case, a heating temperature may be selected according to the types and thicknesses of materials. When the protrusion structures having a rectangular parallelepiped shape are completely melted and deformed into the protrusion structures 110a having a hemispherical convex lens shape, the protrusion structures are cooled and hardened. Then, the protrusion structures 110a having a convex lens shape refract incident light toward a corresponding light-absorbing material of the light-absorbing materials 112.

In forming the light-absorbing materials 112, an interval between patterns of the light-absorbing materials 112 formed on an upper surface of the transparent substrate 110 may be non-uniform such that the interval and size of the finally-formed protrusion structures 110a having a lens shape may be non-uniform. In this case, as previously described, an interference pattern that may be formed by interference between lights reflected on the surface of the protrusion structures 110a is not formed.

The one-way transparent optical system has the same structure as that of the one-way transparent optical system shown in FIG. 5. In this structure, in order to fabricate the one-way transparent optical system shown in FIG. 6, the light transmission layer 150 and the antireflective coating 160 can be consecutively formed on the protrusion structures 110a having a lens shape.

As described above, in the method for fabricating an one-way transparent optical system according to the present invention, external light can be effectively intercepted and an internal light efficiency can be nearly maintained without loss. Thus, when using a display device, glare and a decrease in contrast can be effectively prevented and the brightness of the display device can be increased by nearly 80% compared to the prior art using a polarizer. In addition, since a structure is simple and high-priced materials are not used, manufacturing costs can be reduced compared to the prior art using a polarizer.

Furthermore, since the present invention can be effectively applied regardless of the internal structure of a light-emitting element having any shape including an organic electroluminescent (EL), process and design are advantageous.

In addition, the present invention can be applied to a variety of fields such as illumination or optical design, etc., which requires a transparent layer for selectively intercepting light according to a direction, without design changes, as well as the display device.

In addition, a process is very simple and the number of materials is small such that costs can be reduced.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. A method of fabricating a one-way transparent optical system, the method comprising:

forming a photoresist on an upper surface of a transparent substrate;

heating and carbonizing the photoresist to form a black body layer;

patterning the black body layer to form a plurality of light-absorbing materials on the transparent substrate; and forming protrusion structures having a shape for refracting incident light toward a corresponding light-absorbing material of the light-absorbing materials, on the transparent substrate on which the light-absorbing materials are formed.

2. The method of claim 1, wherein the forming of the black body layer is performed by heating the photoresist to at least 300° C. or more.

3. The method of claim 2, wherein a heating temperature of the photoresist is adjusted so that a light absorption degree of the black body layer is adjusted.

4. The method of claim 1, wherein the patterning of the black body layer comprises:

forming a metallic layer on an upper surface of the black body layer;

patterning the metallic layer in a predetermined pattern;

etching a region of the black body layer that is not covered by the metallic layer; and removing the metallic layer.

5. The method of claim 4, wherein the patterning of the metallic layer in the predetermined pattern comprises:

coating a photoresist on an upper surface of the metallic layer and patterning the photoresist; and etching a metallic layer that is not covered by the photoresist.

6. The method of claim 4, wherein in the etching of the region of the black body layer that is not covered by the metallic layer, the photoresist on the metallic layer is simultaneously removed.

7. The method of claim 4, wherein the black body layer is etched by reactive ion etching (RIE) using $O_2$ as a reactive gas.

8. The method of claim 1, wherein the forming of the protrusion structures comprises:

stacking a transparent optical material on the transparent substrate on which the light-absorbing materials are formed;

patterning the transparent optical material to form a plurality of protrusion structures; and melting and cooling the patterned protrusion structures to form protrusion structures having a convex lens shape.

9. The method of claim 8, wherein the light-absorbing materials are disposed in the center of lower surfaces of the patterned protrusion structures.

10. The method of claim 8, wherein a refractive index of the transparent optical material is substantially the same as a refractive index of the transparent substrate.

11. The method of claim 8, wherein the melting and cooling of the protrusion structures is performed using a bake and reflow process.

12. The method of claim 1, wherein a light transmission layer and an antireflective layer are additionally and consecutively formed on the protrusion structures.

13. The method of claim 12, wherein the refractive index of the light transmission layer is lower than refractive indices of the protrusion structures.

14. The method of claim 1, wherein the protrusion structures have a shape of a convex lens.

* * * * *